(12) United States Patent
Barth et al.

(10) Patent No.: US 10,267,838 B1
(45) Date of Patent: Apr. 23, 2019

(54) CURRENT SENSOR HAVING MICROWAVE CHIP RESISTORS IN PARALLEL RADIAL ARRANGEMENT

(71) Applicants: Jon E. Barth, Boulder City, NV (US); John R. Richner, Boulder City, NV (US)

(72) Inventors: Jon E. Barth, Boulder City, NV (US); John R. Richner, Boulder City, NV (US)

(*) Notice: Subject to any disclaimer, the term of this patent is extended or adjusted under 35 U.S.C. 154(b) by 73 days.

(21) Appl. No.: 15/710,578

(22) Filed: Sep. 20, 2017

Related U.S. Application Data

(60) Provisional application No. 62/397,677, filed on Sep. 21, 2016.

(51) Int. Cl.
| | |
|---|---|
| *G01R 31/12* | (2006.01) |
| *G01R 31/00* | (2006.01) |
| *H01C 10/16* | (2006.01) |
| *G01R 1/067* | (2006.01) |
| *G01R 31/26* | (2014.01) |

(52) U.S. Cl.
CPC ....... *G01R 31/001* (2013.01); *G01R 1/06722* (2013.01); *G01R 1/06733* (2013.01); *H01C 10/16* (2013.01); *G01R 31/2607* (2013.01)

(58) Field of Classification Search
USPC .......................... 324/713, 126, 755.05, 117 R
See application file for complete search history.

(56) References Cited

U.S. PATENT DOCUMENTS

| | | | |
|---|---|---|---|
| 2,399,645 A | 5/1946 | Latimer | |
| 3,646,440 A * | 2/1972 | Wilhelm | G01R 1/203 324/126 |
| 3,665,347 A | 5/1972 | Barth | |
| 2007/0115008 A1* | 5/2007 | Barth | G01R 15/146 324/713 |
| 2015/0369845 A1* | 12/2015 | Salles | H01L 25/065 324/126 |

OTHER PUBLICATIONS

IEC 61000-4-2 Edition 2.0 Dec. 2008, "International Standard Electromagnetic compatibility (EMC)—Part 4-2: Testing and measurement techniques—Electrostatic discharge immunity test," Basic EMC Publication. See for Example, Annexes B and C, pp. 33-44.

* cited by examiner

*Primary Examiner* — Vincent Q Nguyen
(74) *Attorney, Agent, or Firm* — Kenehan & Lambertsen, Ltd.; John C. Lambertsen

(57) ABSTRACT

A current sensor for use with a charged device model (CDM) tester includes an outer conductor and a cylindrical inner conductor. The inner conductor is positioned within a central cylindrical bore of the outer conductor to provide a characteristic transmission line impedance of approximately 50 ohms. A test probe conductor extends from the distal end of the inner conductor and is electrically connected to the inner conductor. An array of self-supporting ceramic chip resistors is radially positioned between the distal ends of the inner conductor and the outer conductor to provide a uniformly distributed resistance between the inner conductor and the outer conductor. When the test probe conductor is applied to a pin of a charged device under test (DUT), a discharge current passes through the resistors and produces a voltage on the inner conductor that is provided as a signal voltage proportional to the discharge current.

16 Claims, 14 Drawing Sheets

CURRENT SENSOR HAVING MICROWAVE CHIP RESISTORS IN PARALLEL RADIAL ARRANGEMENT

RELATED APPLICATIONS

The present application claims the benefit of priority under 35 USC § 119(e) to U.S. Provisional Application No. 62/397,677, filed on Sep. 21, 2016, which is incorporated by reference herein.

BACKGROUND OF THE INVENTION

Field of the Invention

This application is directed to systems for simulating electrostatic discharge (ESD) threats to semiconductor devices.

Description of the Related Art

To simulate electrostatic discharge (ESD) threats to semiconductors, a charged device model (CDM) tester provides a spark discharge to ground applied to each pin on an integrated circuit (IC). Four components of a CDM tester determine the waveform parameters: (1) the verification module; (2) the current sensor; (3) the oscilloscope; and (4) the coaxial cable carrying the discharge waveform from the current sensor to the oscilloscope.

Present techniques for verifying CDM testers combine the time domain response tolerances of all four measurement components. Such combination ignores the individual (and unspecified) electrical characteristics of the four components. Identifying the individual component responses in the time domain using conventional CDM testers has proven to be difficult. Accordingly, no practical specifications have been developed for individual components of the conventional CDM testers.

The current sensor is the critical measurement component in the CDM test head because the requirements for the electrical characteristics of the current sensor are very unusual. Efforts have been made to improve the current sensor response and increase the accuracy of CDM test data. One original current sensor design used a disk current sensing resistor. Supply issues later forced the use of a ring of up to six 6-ohm chip resistors mounted on an FR4 laminate (a glass-reinforced epoxy composite material). An FR4 laminate has many beneficial physical properties; however, its electrical characteristics may become inconsistent at higher frequencies, where the dielectric constant of the material decreases and dielectric loss factors increase. FR4 laminate is a hygroscopic material, and the capacitance and loss factor of the material vary with changes in water content. For example, changes in the water saturation of the air in the testing environment may cause capacitance variations of the FR4 laminate support for the chip resistor ring.

The high frequency verification responses caused by the change in the high frequency current sensing resistor characteristics produced waveform peak values that varied significantly, which required the addition of tuning cavities in front of the current sensing resistor to enable the CDM testers to produce test results that meet legacy values. The need for such calibration techniques raised questions about the accuracy of individual test results and required industry standards committees to establish excessive verification waveform parameter tolerances.

Ordinary FR4-type circuit board material has significant high frequency losses when electric fields pass through the material. When the electric field is in a material with high frequency absorption, the absorption effectively causes the electric field and the current causing the field to lose some of the initial energy the field had before entering the absorptive dielectric material. The high frequency absorption adds measurable impedance. The current sensor is intended to have precisely one ohm of resistance in the chip resistor ring; however, high frequency losses in the circuit board caused by the high frequency energy absorption causes the impedance of the one-ohm current sensing resistor to increase sufficiently to decrease the accuracy of the measurements made using the known current sensor.

To date, a need continues to exist for CDM testers that provide consistent measurement results without requiring calibration techniques before each measurement procedure.

SUMMARY OF THE INVENTION

One aspect of the embodiments disclosed herein is a current sensor that utilizes a 1-ohm current sensing resistor fabricated using ten 10-ohm microwave chip resistors that are closely spaced to one another in an electrically parallel, physically radial arrangement (e.g., a radial array). The radial array of resistors is mounted directly between the inner and outer conductors of a signal output transmission line. The metal contact terminals and the ceramic body of each chip resistor provides the mechanical support for the current sensing resistor assembly such that the resistor array is self-supporting between the two conductors. Thus, the FR4-type circuit board material used in the conventional current sensor is eliminated. A first terminal of each chip resistor is directly attached to the outer conductor body (grounded conductor) and a second terminal of each chip resistor is connector to the inner (signal) conductor.

When mounted in the current sensor, the chip resistors of the radial current sensing resistor array are substantially coplanar with the ground plane. This configuration enables a uniform flow of high frequency current, and provides uniform frequency response and a uniform one-ohm impedance between the signal conductor and the grounded conductor. In an illustrated embodiment, the microwave chip resistors are embodied in a 0603 chip size (e.g., approximately 0.06 inch by 0.03 inch by 0.02 inch). Using the 0603 chip size for the microwave chip resistors minimizes the electrical length of each resistor to a fraction of a wavelength at frequencies up to at least 3 GHz. The resistors exhibit pure resistive properties up to at least such frequencies. The illustrated embodiment uses 50-ohm coaxial transmission line and cable from the 1-Ohm current sensing resistor to the oscilloscope to minimize reflections up to at least 3 GHz.

One aspect of the embodiments disclosed herein is a current sensor for use with a charged device model (CDM) tester. The current sensor includes an outer conductor and a cylindrical inner conductor. The inner conductor is positioned within a central cylindrical bore of the outer conductor to provide a characteristic transmission line impedance of approximately 50 ohms. A test probe conductor extends from the distal end of the inner conductor and is electrically connected to the inner conductor. An array of chip resistors is radially positioned between the inner conductor and the outer conductor at the respective distal ends of the two conductors to provide a uniformly distributed resistance between the inner conductor and the outer conductor. When the test probe conductor is applied to a pin of a charged device under test (DUT), a discharge current passes through the resistors and produces a voltage on the inner conductor that is provided as a signal voltage proportional to the discharge current.

Another aspect in accordance with the embodiments disclosed herein is a current sensor coupleable to a CDM tester to receive an electrostatic discharge from a pin of a device under test (DUT). The current sensor comprises an outer conductor having a proximal end and a distal end. The outer conductor has a cylindrical though bore extending from the proximal end to the distal end. The outer conductor has an inner surface defined by the through bore. The outer conductor has at least one outer conductor shelf located near the distal end. The shelf extends radially inward from the inner surface of the outer conductor. The outer conductor shelf has a contact surface facing toward the distal end of the outer conductor. An inner conductor has a proximal end and a distal end. The inner conductor has a cylindrical outer surface. The inner conductor is positioned concentrically within the through bore of the outer conductor. The inner conductor has at least one inner conductor shelf located near the distal end of the inner conductor. The inner conductor shelf extends radially outward from the outer surface of the inner conductor. The inner conductor shelf has a contact surface facing toward the distal end of the inner conductor. The current sensor includes a plurality of chip resistors. Each chip resistor has a first contact at a first end and a second contact at a second end. Each resistor is positioned with the first contact electrically connected to the contact surface of the inner conductor shelf and with the second contact electrically connected to the contact surface of the outer conductor shelf. The plurality of chip resistors forms a parallel electrical circuit between the distal end of the inner conductor and the distal end of the outer conductor. A test probe conductor extends from the distal end of the inner conductor and is electrically connected to the inner conductor. The test probe conductor is selectively engageable with a pin of a DUT to receive an electrostatic discharge from the pin of the DUT.

In certain embodiments in accordance with this aspect, the current sensor further comprises a central cylindrical bore of the inner conductor. The cylindrical bore extends proximally from the distal end of the inner conductor. The cylindrical bore is concentric with the outer surface of the inner conductor. The cylindrical bore has an inner diameter. A cylindrical adapter sleeve is positioned within the cylindrical bore through the inner conductor. The adapter sleeve has an outer diameter slightly smaller than the inner diameter of the cylindrical bore through the inner conductor such that the adapter sleeve fits tightly within the cylindrical bore of the inner conductor. The adapter sleeve has a central cylindrical bore. The central cylindrical bore of the adapter sleeve is concentric with the cylindrical bore of the inner conductor. The central cylindrical bore of the adapter sleeve has an inner diameter. A pogo pin has a cylindrical outer surface sized to fit tightly within the central cylindrical bore of the adapter sleeve. The test probe extends from a distal end of the pogo pin.

In certain embodiments in accordance with this aspect, each chip resistor has a longitudinal axis between the first end and the second end. Each chip resistor is positioned with the longitudinal axis parallel to a respective radial line extending outward from the center of the inner conductor. In certain embodiments, the plurality of chip resistors comprises ten chip resistors. Each resistor has a nominal resistance of approximately 10 ohms. The plurality of ten chip resistors provides a parallel resistance of approximately 1 ohm.

In certain embodiments in accordance with this aspect, the plurality of chip resistors comprises ten chip resistors. Each resistor has a nominal resistance of approximately 10 ohms. The plurality of ten chip resistors provides a parallel resistance of approximately 1 ohm. In certain embodiments, each of the ten chip resistors comprises a trimmable thin film resistor having a nominal resistance of approximately 10 ohms. Each resistor is selectively trimmable to increase the resistance of the resistor to thereby adjust the parallel resistance to a value closer to 1 ohm.

In certain embodiments in accordance with this aspect, a subminiature version A (SMA) connector is mounted to the proximal end of the outer conductor of the current sensor. The SMA connector includes an outer flange electrically and mechanical connected to the outer conductor of the current sensor. An inner signal conductor of the SMA connector is electrically connected to the inner conductor of the current sensor. In certain embodiments, a distal portion of the inner conductor includes a plurality of cantilevered fingers surrounding the central bore. The cantilevered fingers flex to receive and to electrically engage the inner signal conductor of the SMA connector.

In certain embodiments in accordance with this aspect, the outer surface of the inner conductor is spaced apart from the inner surface of the cylindrical bore of the outer conductor to provide a selected characteristic transmission line impedance between the inner conductor and the outer conductor. In certain embodiments, the selected characteristic transmission line impedance between the inner conductor and the outer conductor is approximately 50 ohms. In certain embodiments, the outer surface of the inner conductor has a diameter of approximately 0.1035 inch and the inner surface of the cylindrical bore of the outer conductor has a diameter of approximately 0.24 inch.

Another aspect of the embodiments disclosed herein is a current sensor coupleable to a CDM tester to receive an electrostatic discharge from a pin of a DUT. The current sensor comprises an outer conductor having a cylindrical inner surface defined by a central through bore between a proximal end and a distal end. The outer conductor includes at least one circumferential outer conductor contact surface located near the distal end and facing in the direction of the distal end. An inner conductor has a cylindrical outer surface. The inner conductor is positioned concentrically within the central through bore of the outer conductor. The inner conductor includes at least one circumferential inner conductor contact surface located near the distal end of the inner conductor and facing in the direction of the distal end of the inner conductor. The current sensor further includes a plurality of chip resistors. Each chip resistor has a first contact electrically connected to the inner conductor contact surface and has a second contact electrically connected to the outer conductor contact surface of the outer conductor shelf. The chip resistors form a parallel electrical circuit between the inner conductor and the outer conductor. A test probe conductor extends from the distal end of the inner conductor and is electrically connected to the inner conductor.

In certain embodiments in accordance with this aspect, the inner conductor contact surface comprises a distal surface of an inner conductor shelf extending radially outward from the outer surface of the inner conductor. The outer conductor contact surface comprises a distal surface of an outer conductor shelf extending radially inward from the cylindrical inner surface of the outer conductor. The distal surface of the inner conductor shelf and the distal surface of the outer surface shelf are substantially coplanar.

In certain embodiments in accordance with this aspect, the diameter of the outer surface of the inner conductor and the diameter of the cylindrical inner surface of the central bore of the outer conductor are selected such that a characteristic transmission line impedance of the inner and outer conductors is approximately 50 ohms. In certain embodiments, the outer surface of the inner conductor has a diameter of approximately 0.1035 inch and the cylindrical inner surface of the cylindrical bore of the outer conductor has a diameter of approximately 0.24 inch. In certain embodiments, the test probe conductor comprises a spring-biased contact extending from the shaft of a pogo pin.

Another aspect of the embodiments disclosed herein is a method for sensing the current generated by a spark discharge from a charged DUT. The method comprises charging the DUT in an electrical field generated by an applied voltage. The method further comprises positioning an electrical contact in engagement with a pin of the DUT to discharge the DUT via the pin and the electrical contact. The discharge of the DUT creates an electrical current. The method further comprises routing the electrical current from the electrical contact to a ground reference via an array of resistors connected between the electrical contact and the ground reference. The array of resistors comprises a plurality of high frequency thin film chip resistors arranged in a substantially equally spaced radial pattern about the electrical contact. The array of resistors provides a known resistance between the electrical contact and the ground reference. The electrical current routed through the array of resistors generates a signal voltage on the electrical contact proportional to the current through the array of resistors. The method further comprises providing the signal voltage as an output signal measurable to determine the magnitude of the electrical current created by the discharge of the DUT.

Another aspect of the embodiments disclosed herein is a method of manufacturing a current sensor. The method comprises positioning a pogo pin in a cylindrical adapter sleeve. The method further comprises positioning the adapter sleeve in a central cylindrical bore of a cylindrical inner conductor. The method further comprises positioning the inner conductor in a cylindrical bore of an outer conductor, the inner conductor positioned concentrically to provide a uniform air gap between an outer surface of the inner conductor and an inner surface of the cylindrical bore of the outer conductor. The method further comprises electrically connecting a respective first end of each resistor of an array of resistors to the inner conductor and electrically connecting a respective second end of each resistor to the outer conductor. The array of resistors is arranged substantially rotationally symmetrically around the inner conductor. In certain embodiments in accordance with this aspect, the method further comprises electrically connecting an outer shell of a subminiature version A (SMA) connector to the outer conductor and electrically connecting an inner signal conductor of the SMA connector to the inner conductor.

BRIEF DESCRIPTION OF THE DRAWINGS

The foregoing aspects and other aspects of this disclosure are described in detail below in connection with the accompanying drawing figures in which.

DETAILED DESCRIPTION OF PREFERRED EMBODIMENTS

A current sensor having microwave chip resistors in parallel radial arrangement is disclosed in the attached drawings and is described below. The embodiment is disclosed for illustration of the current sensor having microwave chip resistors in parallel radial arrangement and is not limiting except as defined in the appended claims.

Figure 1:
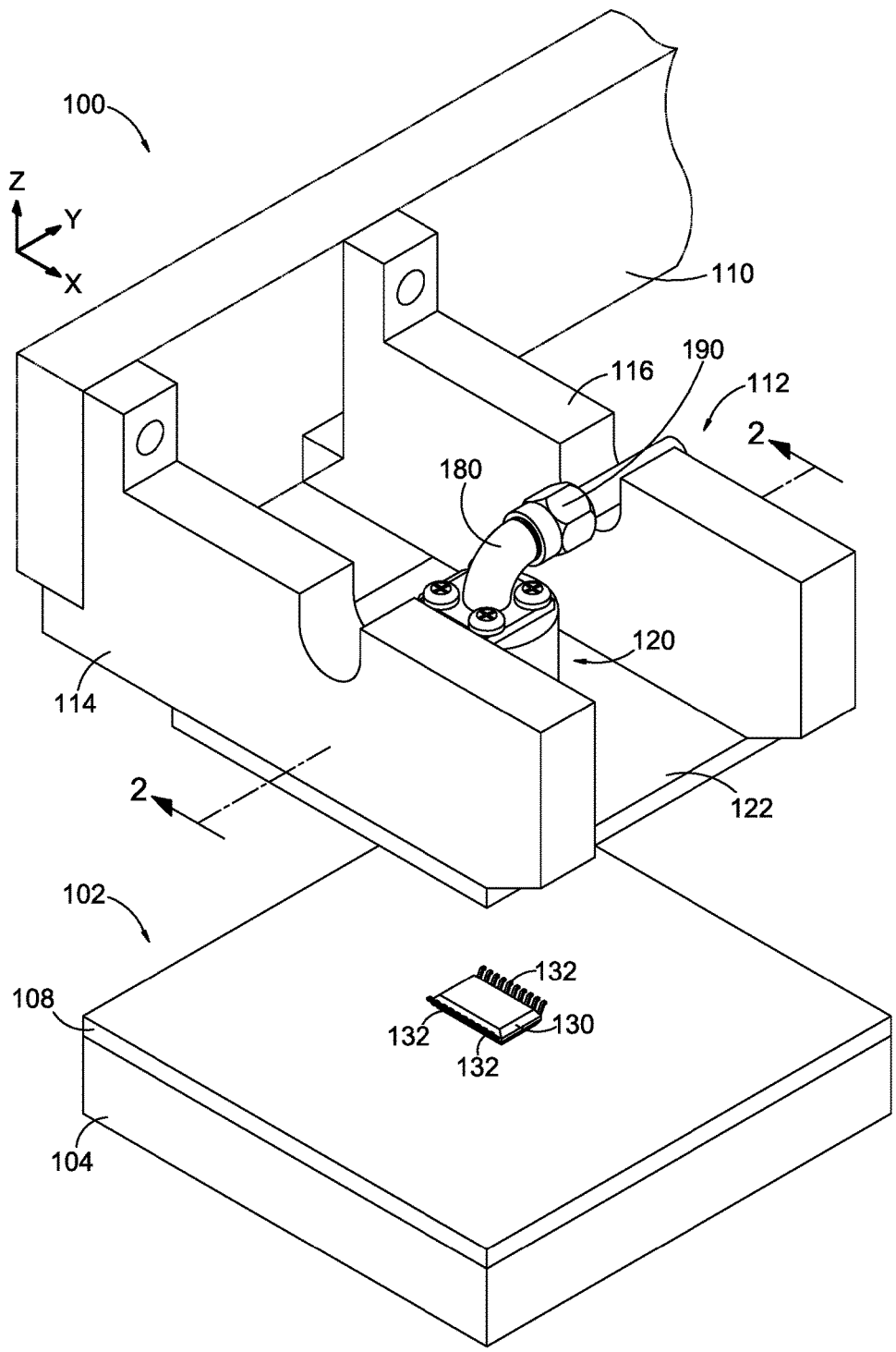
FIG. 1 illustrates a perspective view of the current sensor disclosed herein attached to a support arm (shown in phantom) of a charged device model (CDM) tester, the current sensor above a device under test (DUT) positioned on a support platform of the tester.
Figure 2:
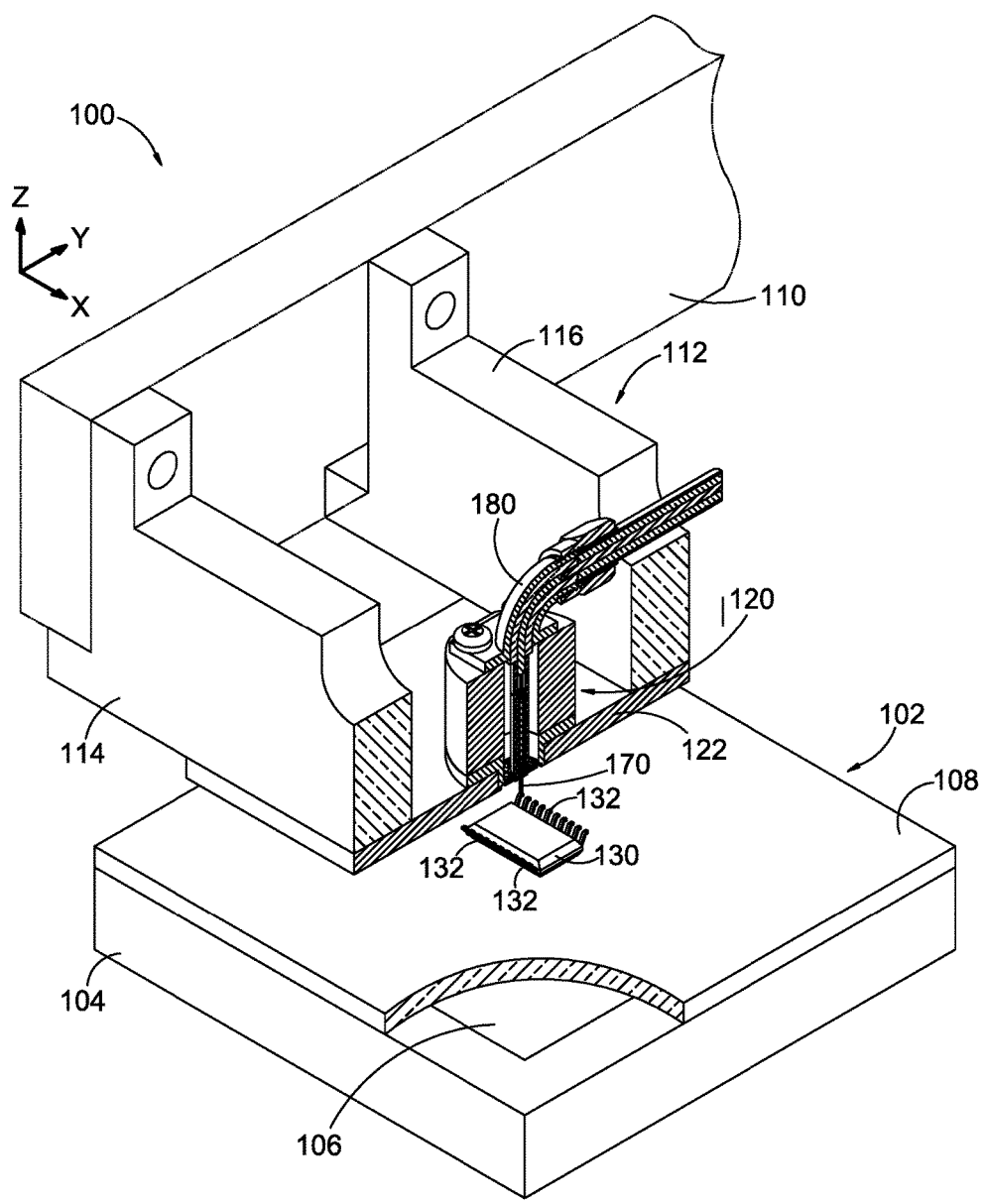
FIG. 2 illustrates a cross-sectional perspective view of the current sensor of FIG. 1 taken along the line 2-2 in FIG. 1, the support platform of the tester remaining as shown in FIG. 1, the view in FIG. 2 showing the test probe in electrical engagement with a pin of the DUT.
Figure 3:
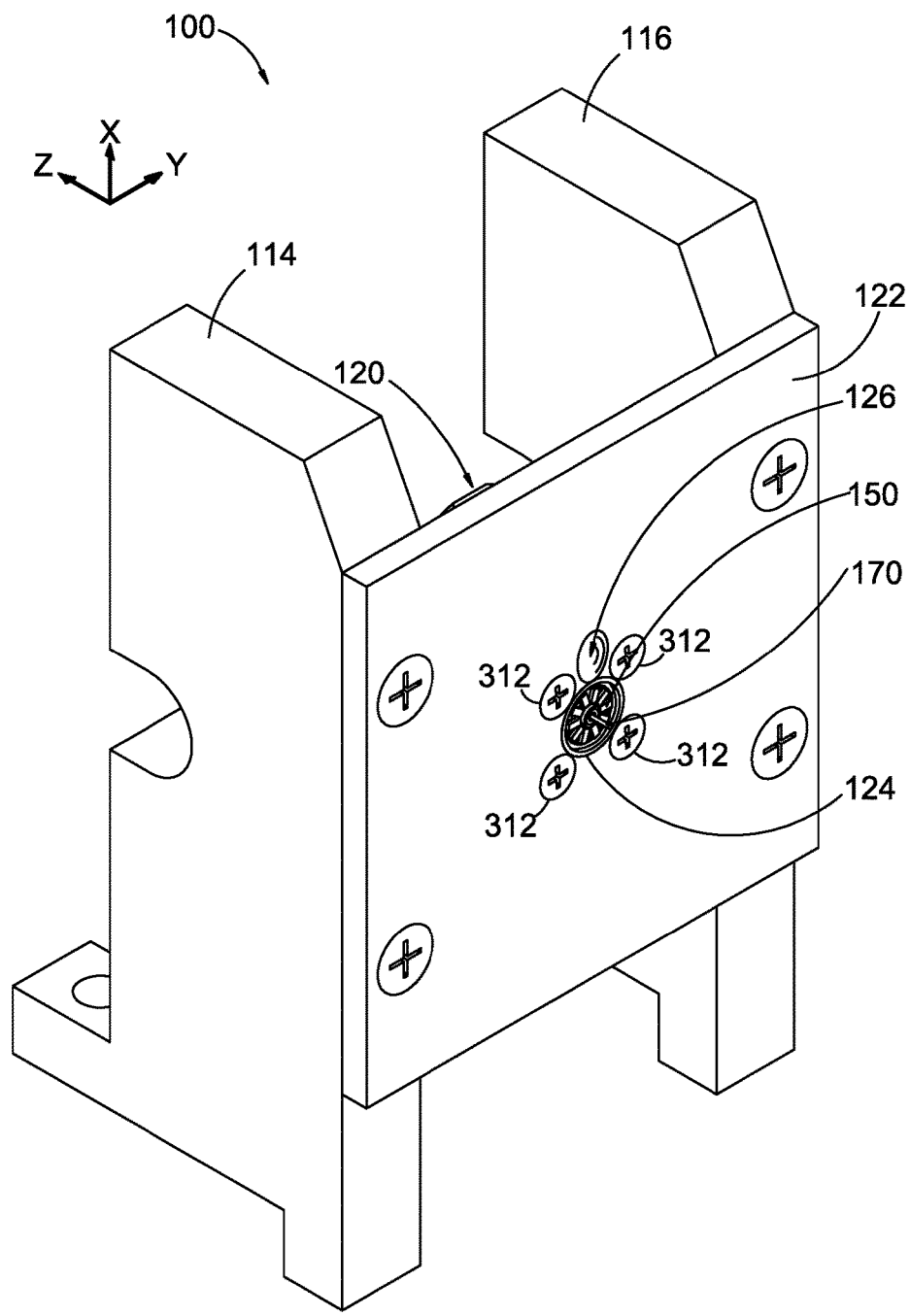
FIG. 3 illustrates a perspective view of the current sensor of FIG. 1 rotated 90 degrees to show the lower surface of the current sensor, wherein the support platform of FIGS. 1 and 2 is not shown in FIG. 3.

Most semiconductor integrated circuits (ICs) include electrostatic discharge (ESD) protection circuitry. Certain industry standards groups require testing of the protective circuitry for parts qualification. FIGS. 1-3 illustrate a schematic representation of portions of a CDM (charged device model) tester 100 into which the current sensor described herein may be incorporated. The CDM tester operates in a known conventional manner to measure the discharge of a charged device under test (DUT) when one of the leads of the DUT contacts a conductive material, which simulates an actual ESD threat.

Only the pertinent portions of the CDM tester 100 are shown in FIGS. 1-3. In particular, the CDM tester includes a test support platform 102 that includes a lower insulating fixture 104, a field-charging electrode 106 (see FIG. 2) and a device support plate 108. The CDM tester further includes a sensor support arm 110 (shown in phantom) that is movable laterally (e.g., the directions of an X-axis and a Y-axis) and vertically (e.g., in the direction of a Z-axis). The CDM tester includes other physical structures that are not shown in FIGS. 1 and 2.

As shown in FIGS. 1-3, an adapter 112, comprising a first adapter rail 114 and a second adapter rail 116, is mechanically coupled to the sensor support arm to move laterally and vertically with the adapter support arm. The adapter is configured to couple the sensor support arm to current sensors having different configurations. The adapter illustrated in FIGS. 1-3 is configured to support a current sensor system 120 above the device support plate 108 to enable movement of the current sensor system with respect to the top of device support plate. The current sensor system is coupled to the adapter via a ground plate (ground plane) 122. The current sensor is inserted into a central bore 124 of the ground plate. In the illustrated embodiment, the ground plate includes a camera access aperture 126 positioned proximate to the central bore of the ground plate to allow a camera (not shown) positioned on an upper surface of the plate to view the active portion of the current sensor below the ground plate. Additional access apertures can be provided to allow additional cameras to view the active portion from different angles.

In FIGS. 2 and 3, a DUT 130 is placed on the device support plate 108 with a plurality of pins 132 of the DUT extending away from the DUT as shown. The electrically charged device support plate is positioned between the field-charging electrode 106 and the ground plate 122 of the current sensor system 120. The plate is charged to a substantial voltage (e.g., 250 volts) by applying a voltage between the ground plane and the field-charging electrode. The DUT resting on the electrically charged plate is thus charged to a corresponding voltage.

Figure 4:
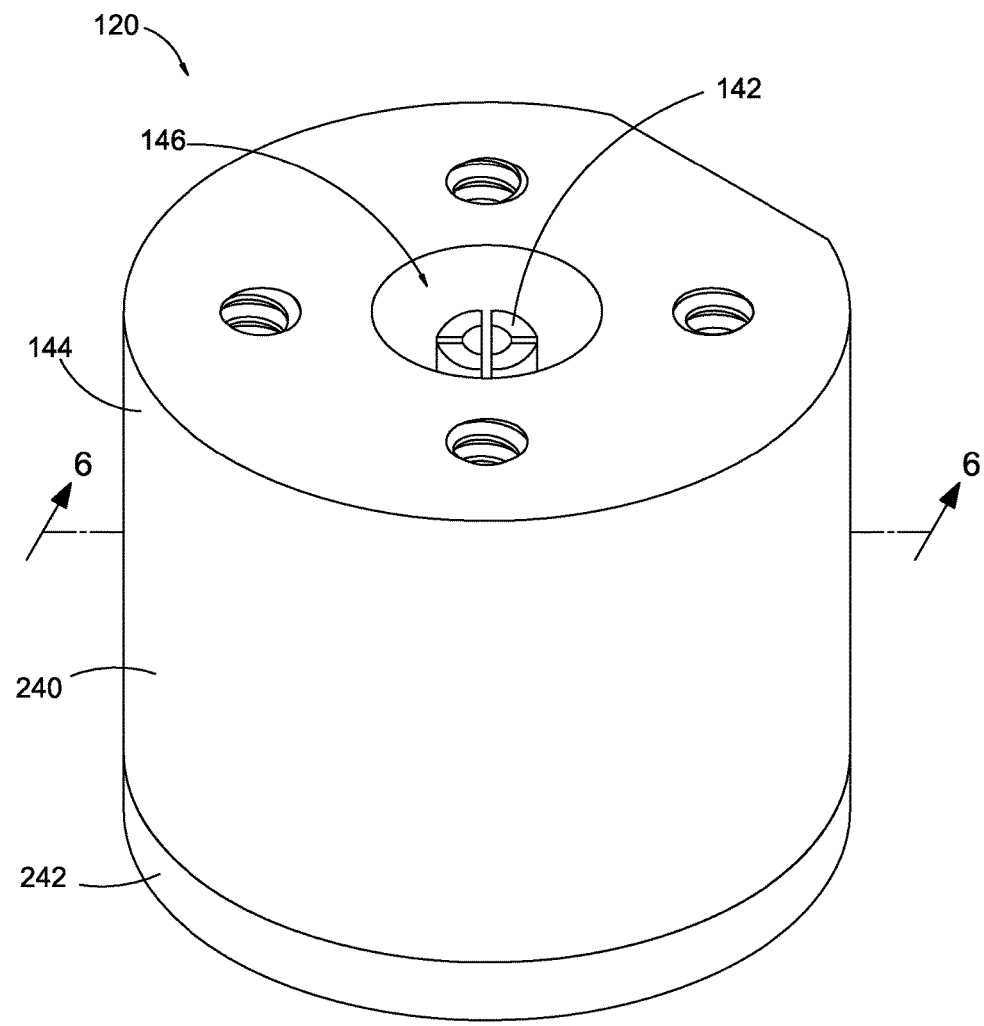
FIG. 4 illustrates an upper perspective view of the current sensor of FIGS. 1-3 with the SMA connector removed.
Figure 5:
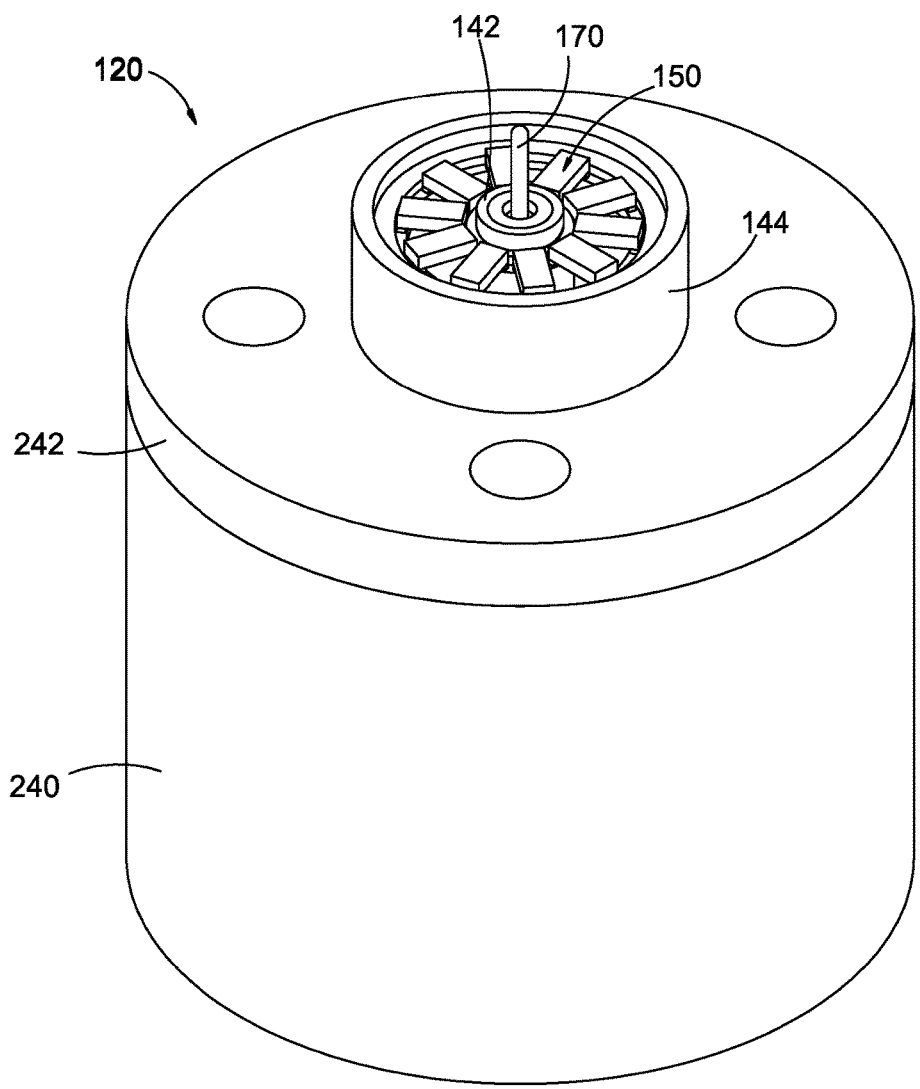
FIG. 5 illustrates a lower perspective view of the current sensor of FIG. 4.
Figure 6:
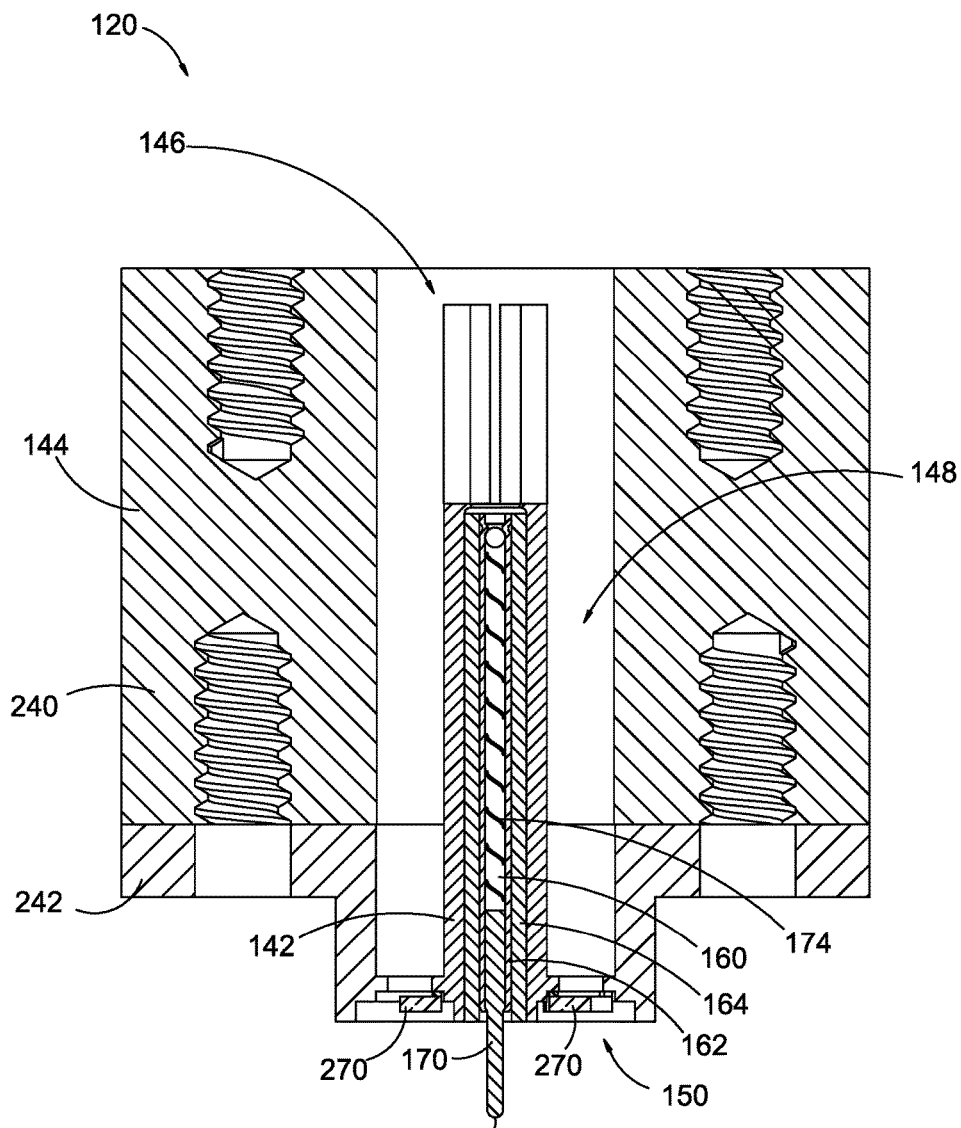
FIG. 6 illustrates a cross-sectional view of the current sensor of FIG. 4 taken along the line 6-6 in FIG. 4.
Figure 7:
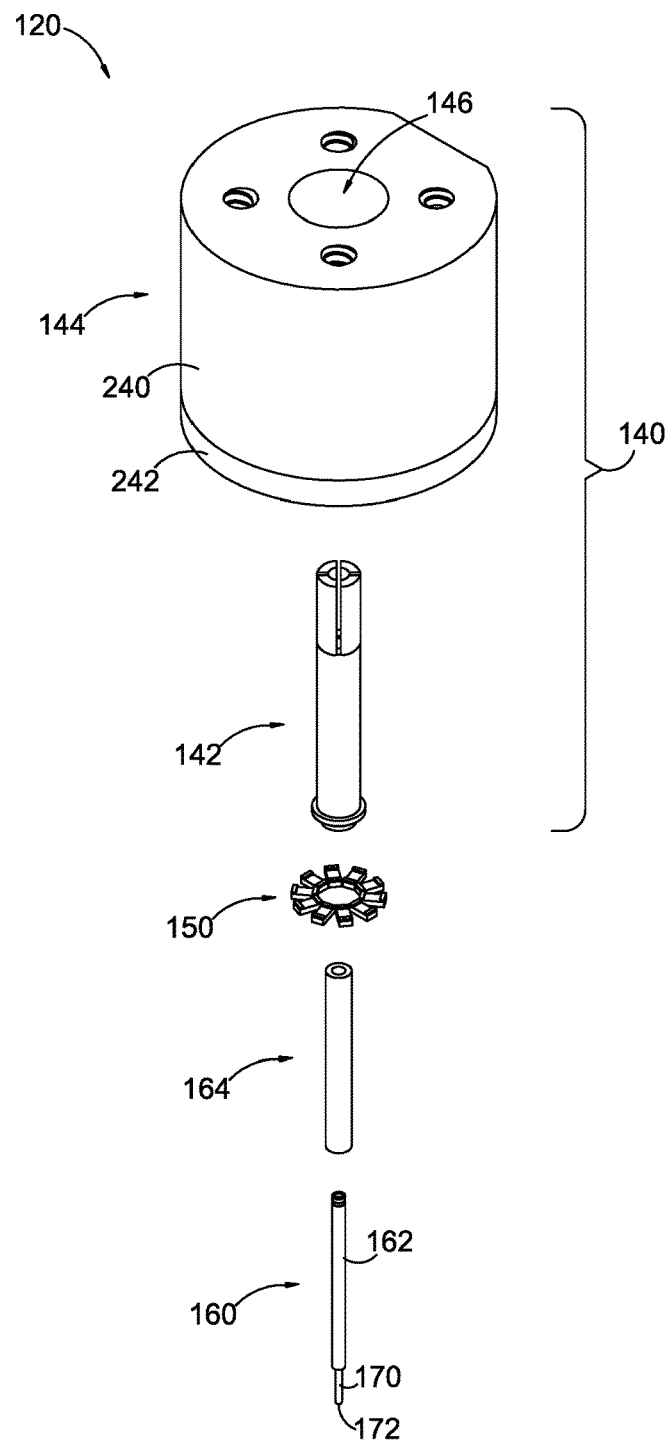
FIG. 7 illustrates an exploded perspective view of the current sensor of FIG. 4.
Figure 17:
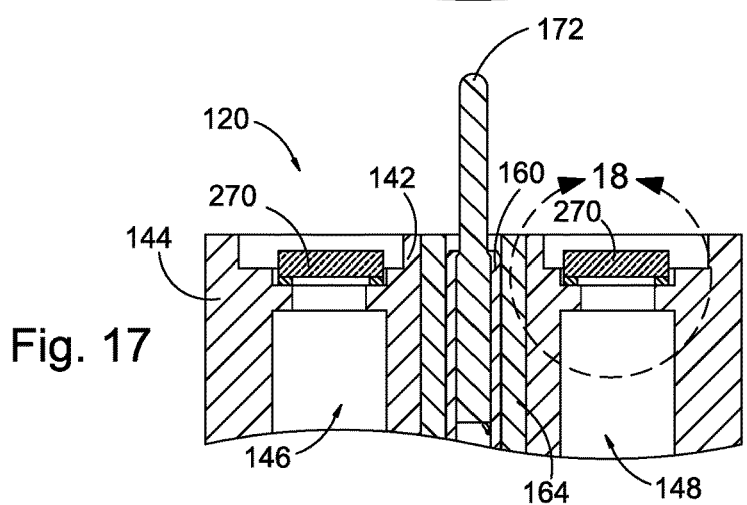
FIG. 17 illustrates a front elevational cross-sectional view of the central portion of the distal end of the current sensor of FIG. 16 and taken along the line 17-17 in FIG. 16.

The current sensor 120 is illustrated in upper and lower perspective views in FIGS. 4 and 5, in a cross-sectional view in FIG. 6 and in an exploded perspective view in FIG. 7. The current sensor 120 includes a sensor body 140 having an inner (center) conductor 142 and an outer conductor 144. The outer conductor is electrically and mechanically coupled to the ground plate 122 via a plurality (e.g., 4) of countersunk screws. In the illustrated embodiment, the outer conductor has a cylindrical central bore 146 having a diameter of approximately 0.24 inch. The inner conductor has an outer diameter of approximately 0.1035 inch. The inner and outer conductors are mutually concentric such that a uniform radial air gap 148 is formed between the outer surface of the inner conductor and the inner surface of the outer conductor as shown in FIG. 6. The respective dimensions of the two conductors and the permittivity of the air between the two conductors cause the two conductors to have a transmission line impedance of approximately 50 ohms. The inner conductor and the outer conductor are electrically connected near the respective distal ends of the two conductors by an array 150 of resistors. The resistor array is described in more detail below. In FIG. 6, the sectioning line 6-6 of FIG. 4 passes through two opposed resistors in the resistor array at a bias, which causes the cross sections of the two resistors to be foreshortened as shown. Two different opposed resistors are cross-sectioned through the middle of the resistors in FIGS. 9, 17 and 18.

The current sensor 120 includes a commercially available pogo pin probe 160 having a generally cylindrical outer shaft 162, which is positioned within a cylindrical adapter sleeve 164. The adapter sleeve comprises an electrically conductive metal (e.g., copper) and has an inner diameter that is selected to receive and snugly secure the outer shaft of the pogo pin probe. In the illustrated embodiment, the inner diameter of the adapter sleeve is approximately 0.033 inch. In the illustrated embodiment, the outer diameter of the pogo pin is approximately 0.032 inch to provide the snug fit between the two elements when the pogo pin is inserted into the adapter sleeve. The adapter sleeve has an outer diameter that is selected to conform to the inner diameter of the inner conductor 142 of the current sensor. In the illustrated embodiment, the outer diameter of the adapter sleeve and the inner diameter of the inner diameter of the inner conductor are both approximately 0.0625 inch, with the outer diameter of the adapter sleeve being slightly smaller than the inner diameter of the inner conductor to allow the adapter sleeve to be press fitted into the inner conductor. The inner diameter of the adapter sleeve can be varied to conform to the outer diameters of pogo probes having different diameters. Thus, the current sensor can be replaced with a different pogo probe having a different outer diameter by using a different adapter sleeve. The inner conductor and the outer conductor do not have to be modified to accommodate a pogo probe with a different outer diameter.

The outer shaft 162 of the pogo probe 160 houses a spring-biased pogo probe extension 170 having a distal contact end 172. During testing, the current sensor 120 is moved laterally and vertically such that the contact end of the pogo probe extension is caused to engage each pin 132 of the DUT 130 in sequence. A spring 174 within the pogo probe assures solid electrical contact with the engaged DUT pin while avoiding bending of the pins with excessive engagement force. For example, FIG. 2 illustrates the pogo probe extension in mechanical and electrical contact with one of the pins of the DUT.

Figure 8:
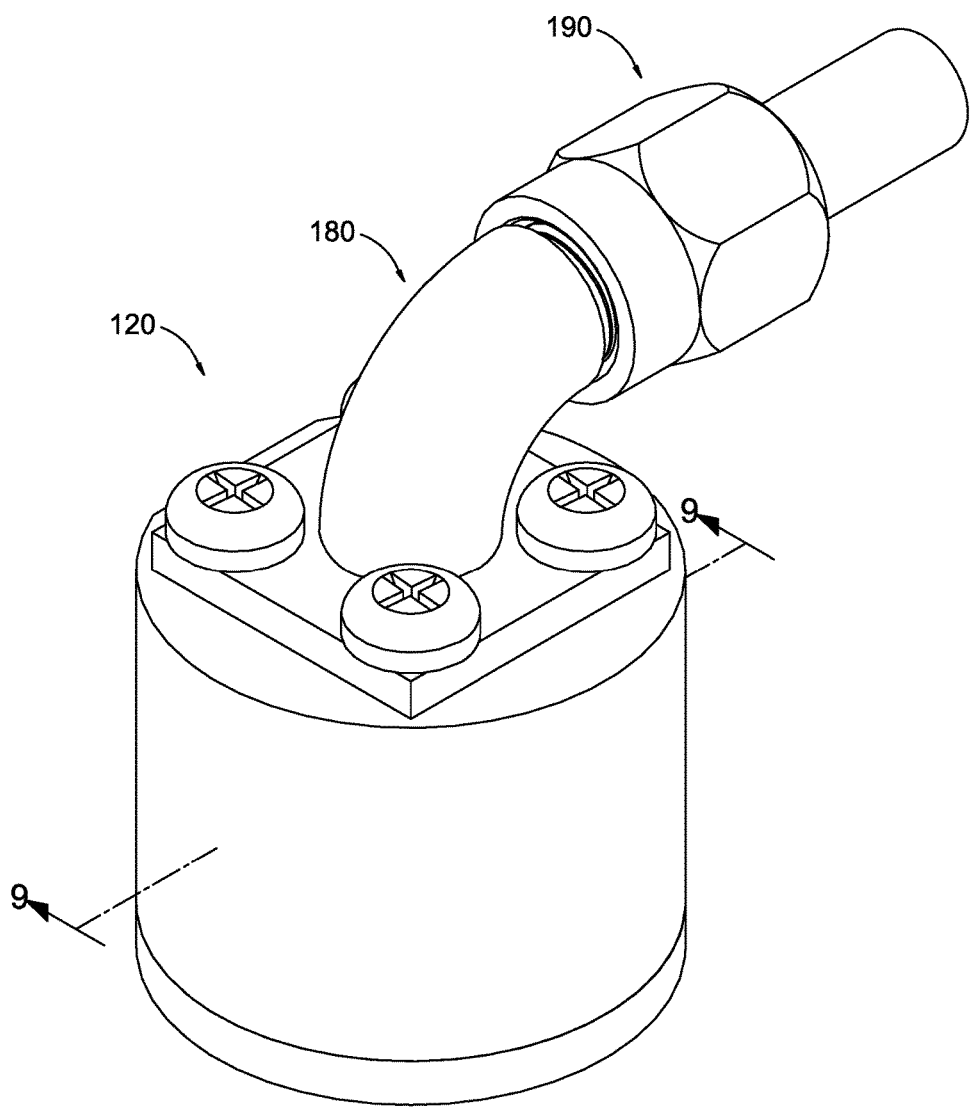
FIG. 8 illustrates a perspective view of the current sensor of FIG. 4 with the SMA connector secured to the current sensor.
Figure 9:
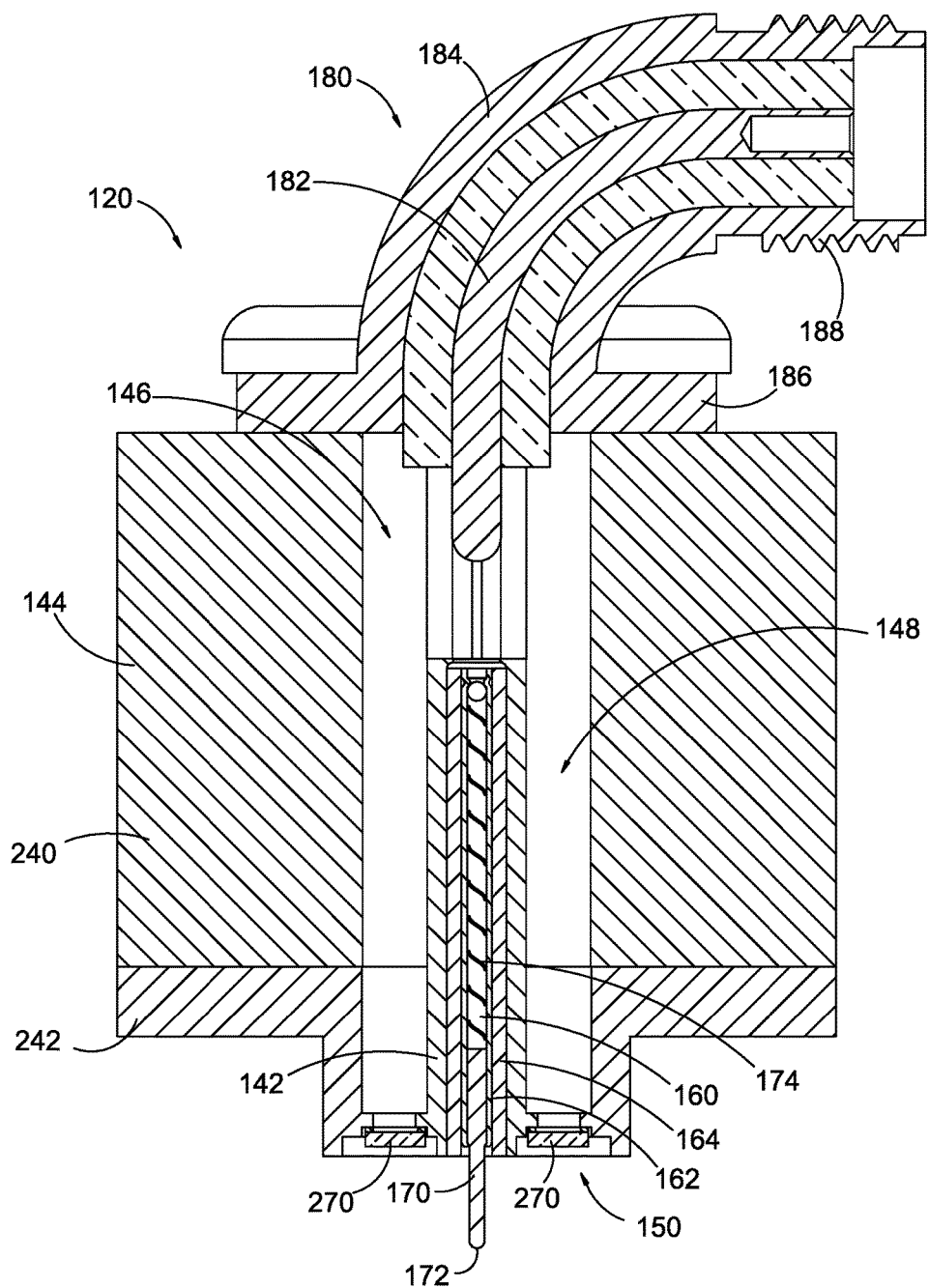
FIG. 9 illustrates an elevational cross sectional view of the current sensor and the SMA connector of FIG. 8 taken along the line 9-9 of FIG. 8.

As shown, for example, in FIG. 9, the proximal end of the center conductor 142 is connected to the center (signal) conductor 182 of an SMA (subminiature version A) connector 180. The SMA connector has an outer shell 184, which is mechanically and electrically connected to the outer conductor 144 via a flange 186 such that the outer shell is connected to ground in a conventional manner. A second end of the SMA connector includes a female connector portion 188, which has outer threads. The female connector portion is connectable to a standard 50-ohm coaxial cable 190 as shown, for example, in FIG. 8. The cable couples the voltage developed across the resistor array 150 to an oscilloscope (not shown) or to other test equipment (not shown). The voltage is analyzed to determine the magnitude of the current generated by the electrostatic discharge via the selected pin 132 of the DUT 130 and to thereby evaluate the efficacy of the internal EDS protection circuitry within the DUT 110.

Figure 10:
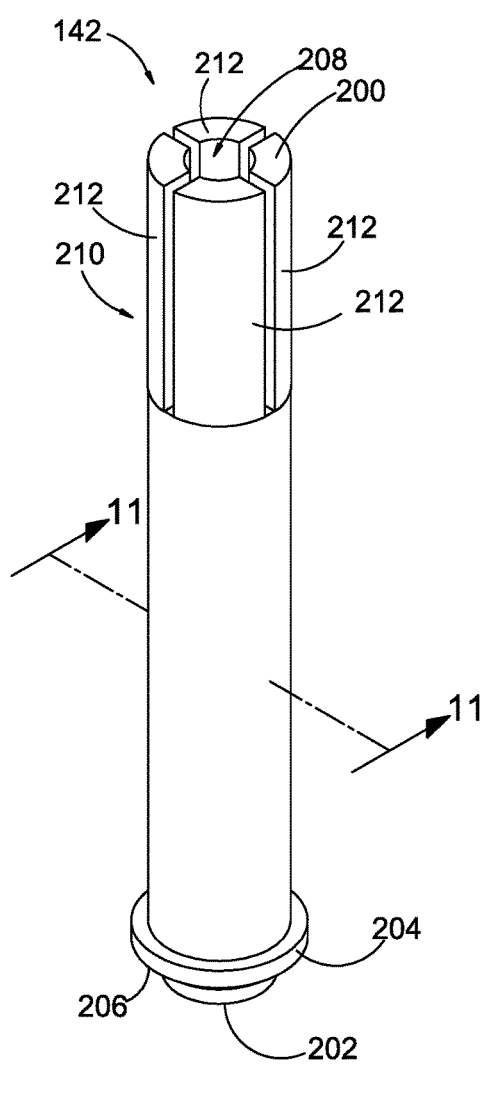
FIG. 10 illustrates a perspective view of the inner conductor of the current sensor of FIG. 4.
Figure 11:
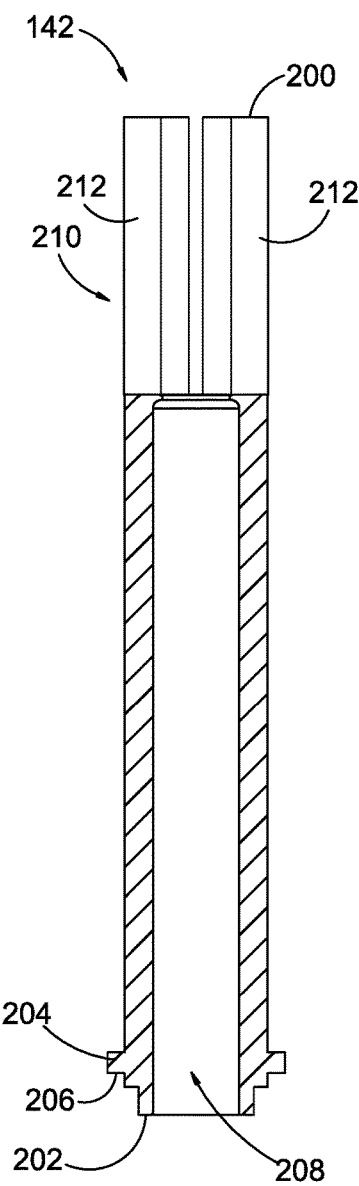
FIG. 11 illustrates a front elevational cross-sectional view of the inner conductor of FIG. 9 taken along the line 11-11 in FIG. 10.

The inner conductor 142 is illustrated in more detail in FIGS. 10 and 11. The inner conductor has a proximal end 200 and a distal end 202. The inner conductor includes a shelf 204, which extends radially outward from the outer surface of the inner conductor near the distal end for a radial distance of approximately 0.0245 inch. The inner conductor shelf has a distal surface 206. A central bore 208 extends through the inner conductor from the proximal end to the distal end. An upper portion 210 of the inner conductor near the proximal end is slotted to allow the upper portion to flex outward when the center conductor 182 (FIG. 9) of the SMA connector 180 is inserted into the central bore of the inner conductor. As illustrated, the slots form the proximal end into a plurality (e.g., 4) of cantilevered flexible fingers 212, which flex outward to receive the center conductor of the SMA connector and which resiliently engage the center conductor to provide a uniform electrical contact with the center conductor. In the illustrated embodiment, the outer wall of the inner conductor is thicker (e.g., the diameter of the central bore is smaller) to strengthen the outer wall at the transition to the cantilevered flexible fingers.

Figures 12, 13:
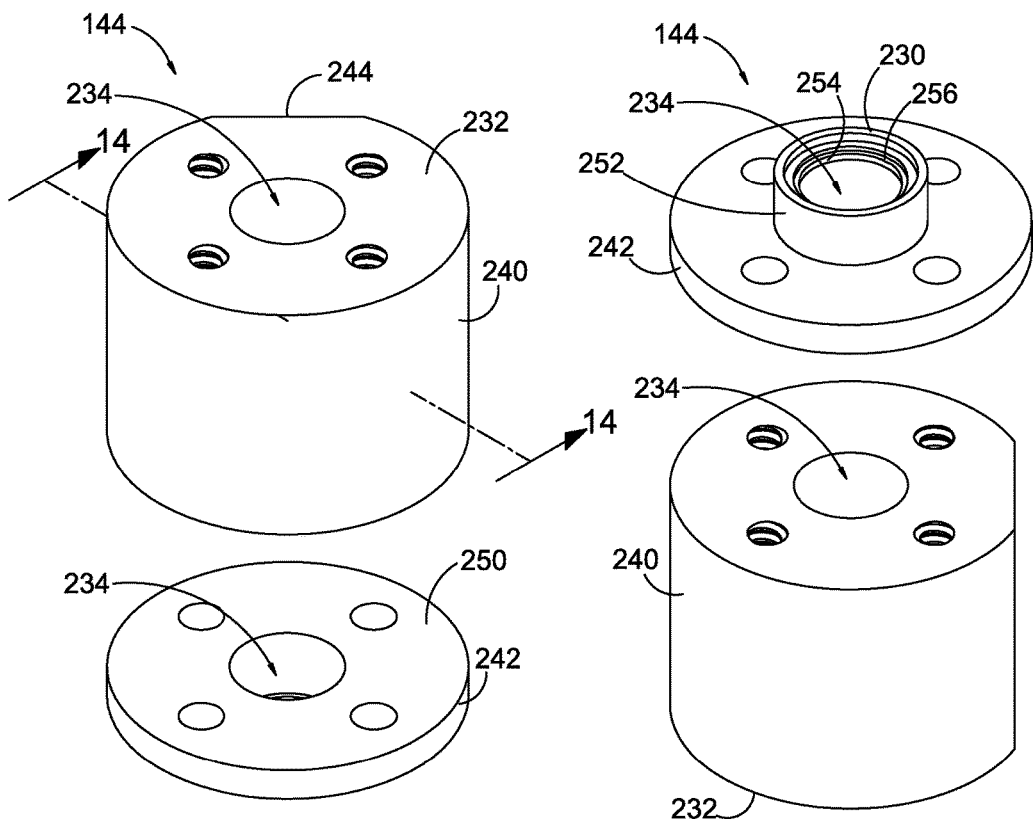
FIG. 12 illustrates an upper exploded perspective view of the outer conductor of the current sensor of FIG. 4, the outer conductor comprising an upper first part and a lower second part.
FIG. 13 illustrates a lower exploded perspective view of the outer conductor of the current sensor of FIG. 4, the view in FIG. 12 showing the distal portion of the lower second part of the outer conductor at the top of the view
Figure 14:
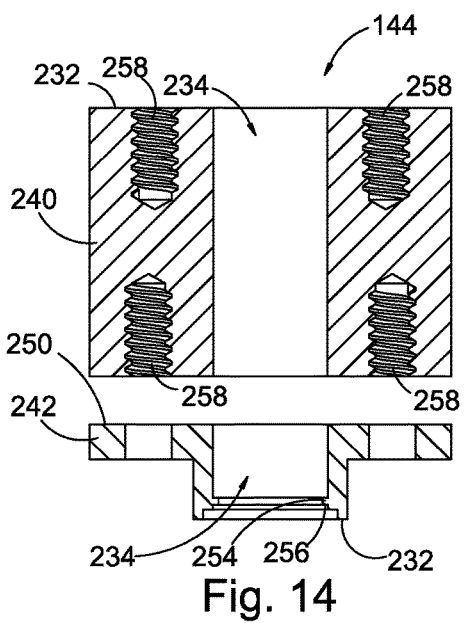
FIG. 14 illustrates a front cross-sectional view of the outer conductor of FIGS. 12 and 13 taken along the line 14-14 in FIG. 12.

The outer conductor 144 is shown in more detail in FIGS. 12-14. The outer conductor has a distal end 230 and a proximal end 232. A cylindrical bore 234 extends through the outer conductor from the distal end to the proximal end. In the illustrated embodiment, the outer conductor comprises a first part 240 and a second part 242. The first part is generally cylindrical with a flattened outer portion 244 for keying. The second part has the shape of a circular flange with a proximal flange surface 250 that engages the first part. A distal portion 252 of the second part has a smaller diameter than the first part. The distal portion is sized to fit snugly within the central bore 124 (FIG. 3) of the ground plate 122. Within the second part, an outer conductor shelf 254 extends radially inward from the inner surface of the cylindrical bore for a radial distance of approximately 0.012 inch. The outer conductor shelf has a distal surface 256. The first part of the outer conductor includes a plurality of threaded bores 258 that receive screws that interconnect the two parts with the ground plane 122 (FIGS. 1-3) and with the flange 186 of the SMA connector 180.

Figure 15:
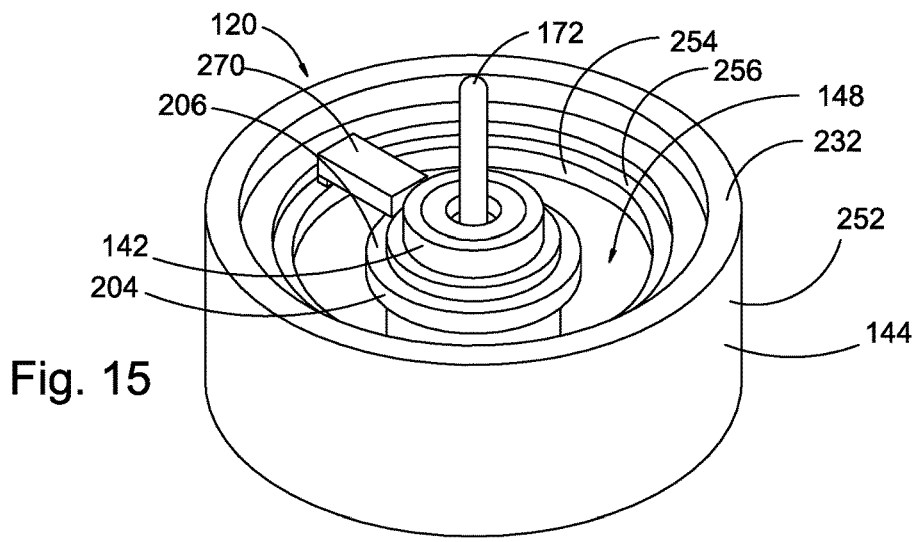
FIG. 15 illustrates an enlarged lower perspective view of the central portion of the distal portion of the current sensor of FIG. 5 showing one of the resistors of the resistor array installed between the inner conductor and the outer conductor.
Figure 16:
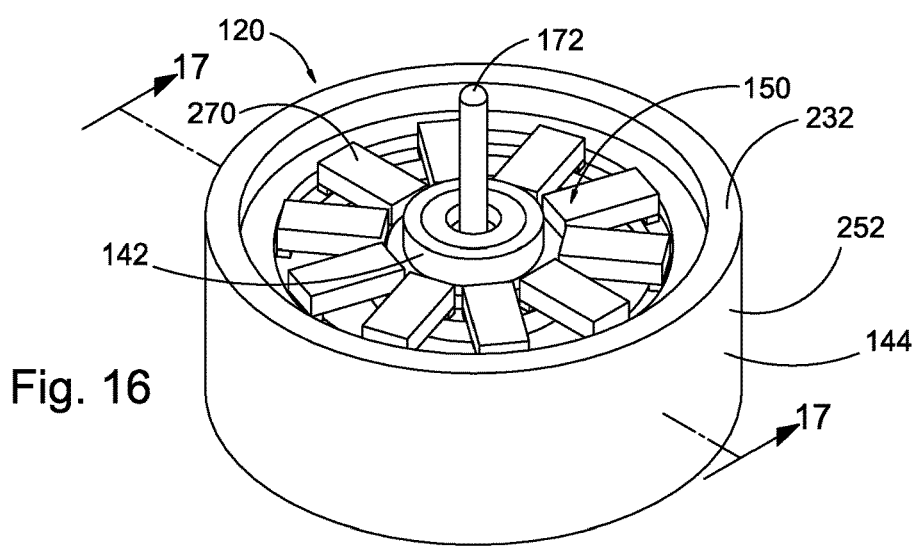
FIG. 16 illustrates the central portion of the distal end of the current sensor as shown in FIG. 15 with the ten resistors of the resistor array installed between the inner conductor and the outer conductor.
Figure 18:
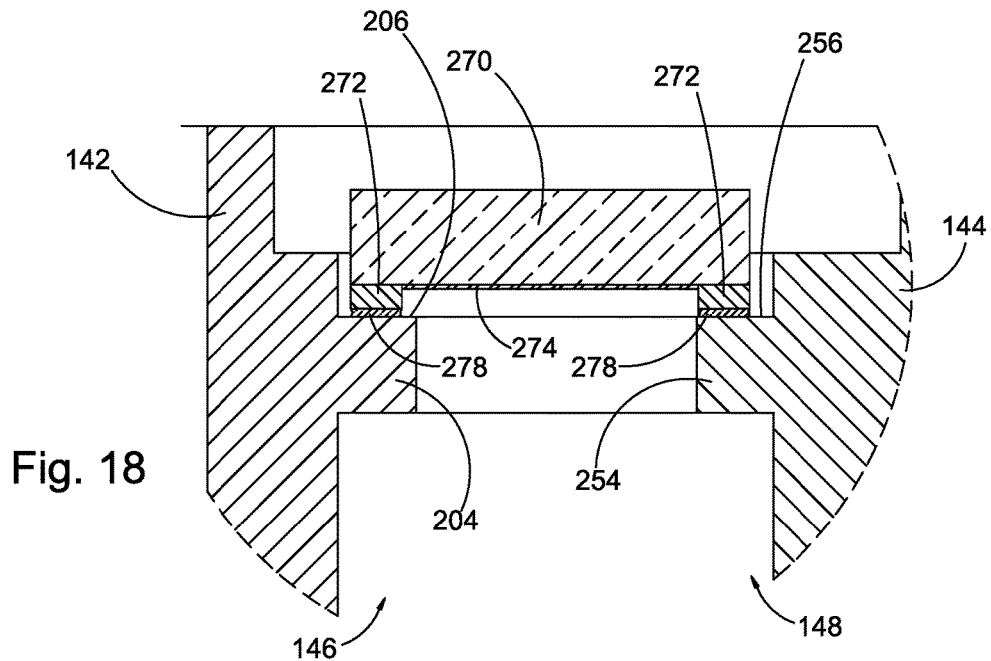
FIG. 18 illustrates an enlarged cross-sectional view of the current sensor of FIG. 17 taken within the area --18-- of FIG. 17.
Figure 19:
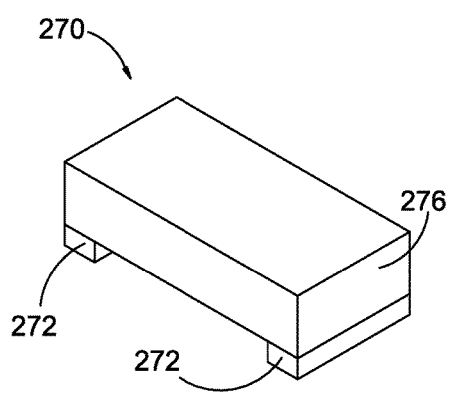
FIG. 19 illustrates an upper perspective view of one of the resistors of FIG. 16.

As illustrated in FIGS. 15-18, the inner conductor 142 is positioned concentrically within the outer conductor 144 with the distal surface 206 of the inner conductor shelf 204 substantially coplanar with the distal surface 256 of the outer conductor shelf 254. The inner conductor shelf receives a respective first end of each of ten microwave chip resistors 270 that comprise the resistor array 150. A first resistor is shown in FIG. 15. The full array of ten resistors is shown in FIG. 16. The outer conductor shelf receives a respective second end of each of the ten resistors. As shown in FIGS. 18 and 19, each resistor includes a respective contact 272 at each end of the resistor. The contacts are in electrical contact with a resistive film 274 positioned on a ceramic substrate 276. The lateral edges of the resistive film can be trimmed to reduce the width of the resistive film and thereby selectively increase the initial resistance of the resistor from an initial nominal value to a desired value. As shown in FIG. 18, at least a portion of each contact of each resistor rests on the respective upper surface of one of the shelves. The contacts of each resistor are mechanically and electrically connected to the upper surfaces by solder 278. As illustrated, the resistors are arranged in a radial array such the ten resistors are spaced apart angularly about the center of the current sensor at angles of approximately 36 degrees between adjacent resistors. In the illustrated embodiment, one end of each resistor is adjacent to the outer surface of the inner conductor. The ten resistors in the array are self-supporting between the inner and outer conductors, which eliminates the need for a circuit board having the issue with impedance variation caused by high frequency absorption.

Electrically connecting one end of each resistor 270 to the inner conductor 142 and electrically connecting the opposite end of each resistor to the outer conductor 144 connects the ten resistors in parallel between the two conductors. In the illustrated embodiment, each resistor has a nominal resistance of approximately 10 ohms such that the parallel array of ten resistors provides an effective resistive impedance of approximately 1 ohm between the two conductors near the distal ends of the two conductors. In the illustrated embodiment, each microwave chip resistor comprises a Model No. CH0603-10RJF resistor, which is commercially available from Vishay Intertechnology, Inc., of Malvern, Pa., and from other sources. In the illustrated embodiment, the resistors are trimmable such that resistors having higher tolerance percentages can be used. One or more of the resistors may be trimmed to achieve the desired 1-ohm resistance of the parallel array of resistors.

Each of the 0603-size chip resistors is approximately 0.031 inch wide by approximately 0.63 inch long by approximately 0.018 inch to 0.020 inch thick. Microwave chip resistors having the illustrated dimensions substantially retain their DC resistance up to frequencies above 3 GHz. The characteristics of the resistor avoid capacitive or inductive parasitic effects on the resistance value at high frequencies. The electrical length of the chip resistor is limited to a small percentage of the wavelength at the highest frequency required of the resistor, which causes the uniform planar resistance film surface of the resistor to retain the desired resistive properties to that required frequency.

When the chip resistors 270 in the resistor array 150 are radially arranged in parallel at the minimum diameter possible with one end of each resistor on the circumference of the inner conductor 142, the adjacent corners of the chip resistors at the ends nearest the inner conductor are spaced apart by approximately a 0.0025 inch. The spacing of the chip resistor ends from the outer surface of the inner conductor and from the inner surface of the outer conductor and their radial arrangement can be adjusted, such as by allowing flotation of the contact pads on the molten solder during attachment. The meniscus force of the molten solder on the terminus of the very small resistors will pull the terminals, and the resistor body, to bring the terminals into complete coverage, if there is space for each resistor to move according to the forces molten solder puts on the metal resistor terminals. The illustrated distances are sufficient to avoid increasing the effective capacitance across the resistive element.

Each resistor 270 is attached to the respective distal surfaces 204, 256 of the connector shelves 202, 256 as illustrated in FIGS. 15-18. The surfaces may be tin-plated, silver-plated or gold-plated surface to enhance the acceptance of soft solder at the chip resistor terminals or terminations. When the soldering process is completed, the ten resistors in the resistor array 150 provide sufficient mechanical support to maintain the distal end 202 of the inner conductor 142 at the center of the central bore 146 of the outer conductor 144. As a unit, the resistors in the resistor array are resistant to moderate forces that may occur during assembly and use, thus preventing breakage of individual resistors.

As illustrated the array 150 of chip resistor 270 is positioned substantially in the same plane as the ground plate 122. This positioning provides a substantially uniform surface over which the high frequency current may uniformly flow from the pogo probe 160 with minimal disruptions. Enabling such a current flow provides a uniform frequency response.

When the contact end 172 of the pogo probe extension 170 engages one of the pins 132 of the DUT 130 (FIGS. 1 and 2), a spark discharge occurs because of the charge on the electrically charged a device support plate 108. Current caused by the spark discharge flows from the DUT pin into the pogo probe extension, to the outer shaft 162 of the pogo pin, to the adapter sleeve 164 and to the inner conductor 142. The current flows from the inner conductor to the outer conductor 144 via the resistor array 150. Accordingly, a voltage develops on the inner conductor proportional to the current flowing through the resistor array at a desired 1-volt per amp sensitivity.

In a presently preferred embodiment, and by way of example and not limitation, the various components of the current sensor 120 are fabricated out of a variety of metals, including aluminum, brass, stainless steel, beryllium copper, phosphor bronze, or the like. The metals may include silver, nickel, or gold plating or a combination of such platings. In the illustrated embodiment, the current sensor is positioned near the center of a flat metal plate comprising the ground plate 122. In one embodiment, the ground plane comprises a plate of ⅛-inch thick brass having a square shape with approximately 2⅜ inches per side. The laterally and vertically moveable support arm 110 of the tester is attached to the ground plane with the first and second adapter rails 114, 115, which comprise nonconductive plastic that enables the current sensor to be attached to the test system x-y-z carriage. The illustrated adapter rails may be reconfigured to interconnect the ground plane to different CDM testers.

As described herein, the housing 144 (e.g., the outer conductor) of the current sensor 120 is a short cylinder of conductive metal (e.g., brass or other suitable conductor), with the distal portion 252 near the distal end 230 of the second part 242 of the outer conductor inserted into the central bore 124 of the ground plate 122. In the illustrated embodiment, each of the first part 240 and the second part of the outer conductor includes the plurality (e.g. 4) of bores 258 that align with corresponding countersunk bores 312 in the ground plane. The bores in the first part of the outer conductor are threaded to receive a corresponding plurality of machine screws to securely engage the outer conductor (e.g., the housing of the current sensor) to the ground plane. The proximal end of the first part of the outer conductor also includes a plurality (e.g., 4) of bores. The bores are positioned to align with bores of the flange 186 of the SMA connector 180. Accordingly, a continuous low resistance ground path is provided from the ground plane to the outer shell 184 of the SMA connector and thus to the coaxial cable 190 connected to the SMA connector.

As described herein, the inner conductor 142 of the current sensor 120 is configured in a manner to function as a containment housing for the pogo pin, as a second attachment point for the current sensing resistors, and as a transmission line center conductor to the output connector. In the illustrated embodiment, the inner conductor comprise an electrically conductive metal, such as, for example, brass. The brass or other metal may be coated to provide a tin-plated, silver-plated, or gold-plated surface to enhance the acceptance of soft solder to enable attachment of the chip contacts 272 of the chip resistors 270. As further discussed above, the inner conductor has a round cross section with an outer diameter selected in combination with the inner diameter of the outer conductor 144 to maintain the necessary diameter ratio, which, in combination with the air dielectric between the inner and outer conductor, maintains the transmission line formed by the two conductors at a substantially constant 50 ohms.

In the illustrated embodiment, the contacts 272 of the current sensing chip resistors 270 are soldered to the inner conductor 142 and to the outer conductor 144. Other connection methods may also be used to electrically and mechanically secure the chip resistors to the inner conductor and the outer conductor.

In the illustrated embodiment, the inner conductor 142 incorporates the electrically conductive adapter sleeve 164 that provides a controlled, snug friction fit with the cylindrical (e.g., tubular) body of the pogo pin probe 160. The adapter sleeve maintains the pogo pin probe in position during use, and also allows the pogo pin probed to be replaced if the pogo pin probe is damaged or becomes worn. As further discussed above, the inner diameter of the adapter pin may be varied to accommodate a pogo pin probe having a different outer diameter.

Figure 20:
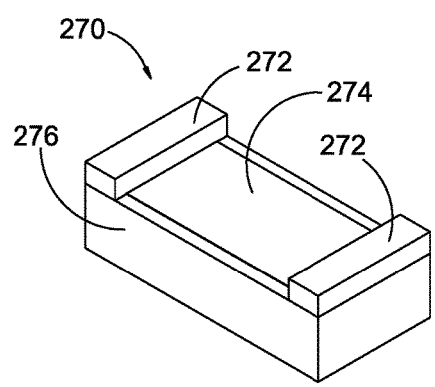
FIG. 20 illustrates a lower perspective view of the resistor of FIG. 19.
Figure 21:
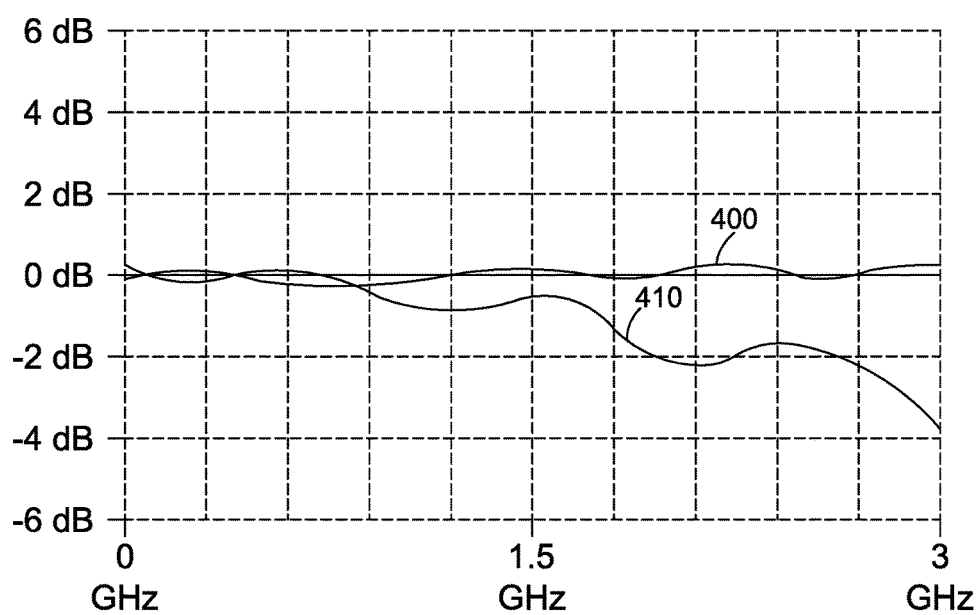
FIG. 21 illustrates a graph of the frequency response deviation from −28.3 dB of the current sensor disclosed herein in comparison with the frequency response deviation of a conventional current sensor.

One manner of use of a presently preferred embodiment of the current sensor 120 disclosed herein is in combination with a commercially available Thermo Electron Key Tek RCDM3 Robotic CDM Test System manufactured by Thermo Electron Corporation of Lowell, Mass. When used with the Key Tek RCDM3 system, the frequency response of the illustrated current sensor is shown in FIG. 20 as a first graphical line 400 that remains close to 0 dB from approximately 1 GHz to approximately 3 GHz. In contrast, the frequency response of a previously known current sensor having a disk resistor is represented by a second graphical line 410. The response of the previous sensor begins to degrade at about 1.3 GHz, and is down to about −2 db to −4 dB at approximately 3 GHz. The 1-ohm resistor array 150 in the illustrated embodiment presents a minimal increase in the CDM discharge impedance circuit over a wide frequency range and has a minimal effect on the discharge current. The amplitude variations shown in the first line of FIG. 20 are caused by reflections from both ends of the sensor's low impedance. The true frequency response values are obtained by averaging the ringing waveforms.

The wide-bandwidth SMA 50-ohm coaxial connector 180 is used in the illustrated embodiment to identify the frequency response and the high frequency impedance of the current sensor 120. When measured in a 50-ohm system, the illustrated current sensor with the one-ohm impedance across the distal ends of the conductors 136, 138 produces a nominal attenuation of 26/1 (voltage in to voltage out ratio), where 0 dB on the first graphical line 400 of FIG. 20 is −28.30 dB when measured in a 50-ohm system. The S11 values (reflection coefficients) of the current sensor remain at one-ohm impedance over the operating frequency range of 500 MHz to 3,000 MHz.

In contrast to the uniform frequency response of the illustrated current sensor, the response of the previous sensor, represented by the graphic line 410 in FIG. 20, shows an average response sensitivity that decreases with increasing frequency, which corresponds to the impedance of the previous sensor increasing with frequency.

One skilled in art will appreciate that the foregoing embodiments are illustrative of the present invention. The present invention can be advantageously incorporated into alternative embodiments while remaining within the spirit and scope of the present invention, as defined by the appended claims.

What is claimed is:

1. A current sensor coupleable to a charged device model (CDM) tester to receive an electrostatic discharge from a pin of a device under test (DUT), the current sensor comprising:
    an outer conductor having a proximal end and a distal end, the outer conductor having a cylindrical though bore extending from the proximal end to the distal end, the outer conductor having an inner surface defined by the through bore, the outer conductor including at least one outer conductor shelf located near the distal end, the shelf extending radially inward from the inner surface, the outer conductor shelf having a contact surface facing toward the distal end of the outer conductor;
    an inner conductor having a proximal end and a distal end, the inner conductor having a cylindrical outer surface, the inner conductor positioned concentrically within the through bore of the outer conductor, the inner conductor having at least one inner conductor shelf located near the distal end of the inner conductor, the inner conductor shelf extending radially outward from the outer surface of the inner conductor, the inner conductor shelf having a contact surface facing toward the distal end of the inner conductor;
    a plurality of chip resistors, each chip resistor having a first contact at a first end and a second contact at a second end, each resistor positioned with the first contact electrically connected to the contact surface of the inner conductor shelf and with the second contact electrically connected to the contact surface of the outer conductor shelf, the plurality of chip resistors forming a parallel electrical circuit between the distal end of the inner conductor and the distal end of the outer conductor; and
    a test probe conductor extending from the distal end of the inner conductor and electrically connected to the inner conductor, the test probe conductor selectively engageable with a pin of a DUT to receive an electrostatic discharge from the pin of the DUT.

2. The current sensor as defined in claim 1, further comprising:
    a central cylindrical bore of the inner conductor, the cylindrical bore extending proximally from the distal end of the inner conductor, the cylindrical bore concentric with the outer surface of the inner conductor, the cylindrical bore having an inner diameter;
    a cylindrical adapter sleeve positioned within the cylindrical bore of the inner conductor, the adapter sleeve having an outer diameter slightly smaller than the inner diameter of the cylindrical bore of the inner conductor such that the adapter sleeve fits tightly within the cylindrical bore of the inner conductor, the adapter sleeve having a central cylindrical bore, the central cylindrical bore of the adapter sleeve concentric with the cylindrical bore of the inner conductor, the central cylindrical bore of the adapter sleeve having an inner diameter; and
    a pogo pin having a cylindrical outer surface sized to fit tightly within the central cylindrical bore of the adapter sleeve, the test probe extending from a distal end of the pogo pin.

3. The current sensor as defined in claim 1, wherein:
    each chip resistor has a longitudinal axis between the first end and the second end; and
    each chip resistor is positioned with the longitudinal axis parallel to a respective radial line extending outward from the center of the inner conductor.

4. The current sensor as defined in claim 1, wherein the plurality of chip resistors comprises ten chip resistors, each resistor having a nominal resistance of approximately 10 ohms, the plurality of ten chip resistors providing a parallel resistance of approximately 1 ohm.

5. The current sensor as defined in claim 1, wherein the plurality of chip resistors comprises ten chip resistors, each resistor having a nominal resistance of approximately 10 ohms, the plurality of ten chip resistors providing a parallel resistance of approximately 1 ohm.

6. The current sensor as defined in claim 5, wherein each of the ten chip resistors comprises a trimmable thin film resistor having a nominal resistance of approximately 10 ohms, each resistor selectively trimmable to increase the resistance of the resistor to thereby adjust the parallel resistance to a value closer to 1 ohm.

7. The current sensor as defined in claim 1, further comprising a subminiature version A (SMA) connector mounted to the proximal end of the outer conductor of the current sensor, the SMA connector including:
    an outer flange electrically and mechanical connected to the outer conductor of the current sensor; and
    an inner signal conductor electrically connected to the inner conductor of the current sensor.

8. The current sensor as defined in claim 7, wherein a distal portion of the inner conductor includes a plurality of cantilevered fingers surrounding the central bore, the cantilevered fingers flexing to receive and to electrically engage the inner signal conductor of the SMA connector.

9. The current sensor as defined in claim 1, wherein the outer surface of the inner conductor is spaced apart from the inner surface of the cylindrical bore of the outer conductor to provide a selected characteristic transmission line impedance between the inner conductor and the outer conductor.

10. The current sensor as defined in claim 9, wherein the selected characteristic transmission line impedance between the inner conductor and the outer conductor is approximately 50 ohms.

11. The current sensor as defined in claim 10, wherein the outer surface of the inner conductor has a diameter of approximately 0.1035 inch and the inner surface of the cylindrical bore of the outer conductor has a diameter of approximately 0.24 inch.

12. A current sensor coupleable to a charged device model (CDM) tester to receive an electrostatic discharge from a pin of a device under test (DUT), the current sensor comprising:
    an outer conductor having a cylindrical inner surface defined by a central through bore between a proximal end and a distal end, the outer conductor including at least one circumferential outer conductor contact surface located near the distal end and facing in the direction of the distal end;
    an inner conductor having a cylindrical outer surface, the inner conductor positioned concentrically within the central through bore of the outer conductor, the inner conductor including at least one circumferential inner conductor contact surface located near the distal end of the inner conductor and facing in the direction of the distal end of the inner conductor;
    a plurality of chip resistors, each chip resistor having a first contact electrically connected to the inner conductor contact surface and having a second contact electrically connected to the outer conductor contact surface of the outer conductor shelf, the chip resistors forming a parallel electrical circuit between the inner conductor and the outer conductor; and a test probe conductor extending from the distal end of the inner conductor and electrically connected to the inner conductor.

13. The current sensor as defined in claim 12, wherein:

the inner conductor contact surface comprises a distal surface of an inner conductor shelf extending radially outward from the outer surface of the inner conductor;

the outer conductor contact surface comprises a distal surface of an outer conductor shelf extending radially inward from the cylindrical inner surface of the outer conductor; and the distal surface of the inner conductor shelf and the distal surface of the outer surface shelf are substantially coplanar.

14. The current sensor as defined in claim 12, wherein the diameter of the outer surface of the inner conductor and the diameter of the cylindrical inner surface of the central bore of the outer conductor are selected such that a characteristic transmission line impedance of the inner and outer conductors is approximately 50 ohms.

15. The current sensor as defined in claim 14, wherein the outer surface of the inner conductor has a diameter of approximately 0.1035 inch and the cylindrical inner surface of the cylindrical bore of the outer conductor has a diameter of approximately 0.24 inch.

16. The current sensor as defined in claim 14, wherein the test probe conductor comprises a spring-biased contact extending from the shaft of a pogo pin.

\* \* \* \* \*